US012566220B2

(12) United States Patent
Eaves

(10) Patent No.: US 12,566,220 B2
(45) Date of Patent: Mar. 3, 2026

(54) METHOD FOR DETECTING A SERIES RESISTANCE FAULT IN A DIGITAL-ELECTRICITY TRANSMISSION SYSTEM

(71) Applicant: VoltServer, Inc., East Greenwich, RI (US)

(72) Inventor: Stephen S. Eaves, Charlestown, RI (US)

(73) Assignee: VoltServer, Inc., East Greenwich, RI (US)

( * ) Notice: Subject to any disclaimer, the term of this patent is extended or adjusted under 35 U.S.C. 154(b) by 515 days.

(21) Appl. No.: 17/980,118

(22) Filed: Nov. 3, 2022

(65) Prior Publication Data

US 2023/0053450 A1     Feb. 23, 2023

Related U.S. Application Data

(63) Continuation-in-part of application No. 17/006,340, filed on Aug. 28, 2020, now Pat. No. 11,499,997.

(Continued)

(51) Int. Cl.
*G01R 31/58*      (2020.01)
*G01R 19/10*      (2006.01)
(Continued)

(52) U.S. Cl.
CPC ............ *G01R 31/58* (2020.01); *G01R 19/10* (2013.01); *H02H 3/28* (2013.01); *H02H 3/40* (2013.01)

(58) Field of Classification Search
CPC .......... G01R 31/58; G01R 19/10; H02H 3/28; H02H 3/40; H02H 7/226
See application file for complete search history.

(56) References Cited

U.S. PATENT DOCUMENTS 10,714,930 B1     7/2020   Weiss et al.
11,499,997 B2     11/2022  Eaves
              (Continued)

OTHER PUBLICATIONS

US Patent and Trademark Office, PCT International Search Report and Written Opinion for PCT/US2023/077209 (related PCT application) (Mar. 28, 2024).
              (Continued)

*Primary Examiner* — Catherine T. Rastovski
*Assistant Examiner* — Yossef Korang-Beheshti
(74) *Attorney, Agent, or Firm* — Robert J. Sayre; Modern Times Legal

(57)     ABSTRACT

In a digital-electricity power system, an electrical-current sample value is acquired along with a voltage sample value within a time window over which the electrical current and voltage are substantially unchanged. A transmission-line series voltage is derived from the difference between the voltage at the transmitter and the voltage at the receiver. Each transmission-line series voltage is divided by a corresponding stored electrical-current sample value to generate a ratio indicative of transmission-line series resistance. These steps are repeated, and the transmitter-disconnect device is placed in a non-conducting state if a difference in the ratio generated in one or more time periods exceeds a predetermined maximum, wherein exceeding the predetermined maximum is indicative of a series resistance fault. Alternatively, a series resistance value, determined by dividing a change in voltage over a change in current, is evaluated to detect a fault.

14 Claims, 2 Drawing Sheets

Related U.S. Application Data

(60) Provisional application No. 62/893,281, filed on Aug. 29, 2019.

(51) Int. Cl.
H02H 3/28 (2006.01)
H02H 3/40 (2006.01)

(56) References Cited

U.S. PATENT DOCUMENTS

2007/0279039 A1    12/2007    Seki
2009/0204268 A1     8/2009    Eaves
2012/0075759 A1*    3/2012    Eaves ..................... H02H 3/44
                                                         361/86
2013/0103220 A1     4/2013    Eaves
2015/0103954 A1     4/2015    Funahashi et al.
2015/0207318 A1     7/2015    Lowe et al.
2015/0215001 A1*    7/2015    Eaves ................... H04L 1/0033
                                                         375/257
2016/0134331 A1     5/2016    Eaves
2017/0214236 A1     7/2017    Eaves
2017/0229886 A1*    8/2017    Eaves ................... H02J 7/0034
2018/0313886 A1    11/2018    Mlyniec et al.

OTHER PUBLICATIONS

S. Katayama, et al., "Analytical voltage estimation in power packet dispatching network," Nonlinear Theory and Its Applications, IEICE (Dec. 30, 2021).

US Patent and Trademark Office, PCT International Search Report and Written Opinion for PCT/US2020/048579 (related PCT application) (Nov. 17, 2020).

* cited by examiner

METHOD FOR DETECTING A SERIES RESISTANCE FAULT IN A DIGITAL-ELECTRICITY TRANSMISSION SYSTEM

RELATED APPLICATION

This application is a continuation-in-part of U.S. application Ser. No. 17/006,340, filed on 28 Aug. 2020, and also claims the benefit of U.S. Provisional Application No. 62/893,281, filed 29 Aug. 2019, the entire content of each of which is incorporated herein by reference.

FIELD OF INVENTION

This invention relates to power-distribution-system safety-protection devices—for example, power-distribution systems with electronic monitoring to detect and disconnect power in the event of an electrical fault or safety hazard, particularly where the power transmission lines are dissipating an abnormally high amount of power loss—often called a "resistive fault" or "in-line fault". More specifically, this invention can be used in digital-electricity transmission systems. This invention is applicable to general power distribution and, in exemplifications, to, e.g., electric vehicle charging, telecommunications or alternative energy power systems.

BACKGROUND

Digital electric power, or digital electricity, can be characterized as any power format where electrical power is distributed in discrete, controllable units of energy. Packet energy transfer (PET) is a new type of digital electric power protocol disclosed in U.S. Pat. Nos. 8,068,937, 8,781,637 (Eaves '637), and international patent application PCT/US2017/016870, filed 7 Feb. 2017.

The primary discerning factor in a digital-power transmission system compared to traditional analog power systems is that the electrical energy is separated into discrete units; and individual units of energy can be associated with analog and/or digital information that can be used for the purposes of optimizing safety, efficiency, resiliency, control, or routing. Since the energy in a PET system is transferred as discrete quantities, or quanta, it can be referred to as "digital power" or "digital electricity".

As described in Eaves '637, a source controller and a load controller are connected by power-transmission lines. The source controller of Eaves '637 periodically isolates (disconnects) the power transmission lines from the power source and analyzes, at a minimum, the voltage characteristics present at the source-controller terminals directly before and after the lines are isolated. The time period when the power lines are isolated was referred to by Eaves '637 as the "sample period", and the time period when the source is connected is referred to as the "transfer period". The rate of rise and decay of the voltage on the lines before, during and after the sample period reveal if a fault condition is present on the power transmission lines. Measurable faults include, but are not limited to, short circuits, high line resistance, or the presence of an individual who has improperly come in contact with the transmission lines.

Eaves '637 also describes digital information that may be sent between the source and load controllers over the power transmission lines to further enhance safety or provide general characteristics of the energy transfer, such as total energy or the voltage at the load controller terminals. One method for communications on the same digital-power transmission lines as used for power was further described and refined in U.S. Pat. No. 9,184,795 (Eaves Communication Patent).

U.S. Pub. Pat Application No. 2016/0134331 A1 (Eaves Power Elements) describes the packaging of the source-side components of Eaves '637, in various configurations, into a device referred to as a digital-power transmitter.

U.S. Pat. No. 9,419,436 (Eaves Receiver Patent) describes the packaging of various configurations of the load-side components of Eaves '637 into a device referred to as a digital-power receiver.

U.S. Pub. Pat Application No. 2018/0313886 A1 (Mlyniec Line Integrity) describes methods for verifying that voltage measurements on the transmitter side of the system meet minimum requirements for integrity in an environment containing electrical noise and where certain transmission-line properties are unknown.

The methods described in this specification build on the earlier work of Eaves '637 and Mlyniec Line Integrity by focusing on a novel method to ensure the accurate detection of what was described in Eaves '637 as an "in-line" fault. The electrical industry often uses the term, "resistive fault", interchangeably with "in-line" fault. In-line faults are defined as a fault where excessive power losses are experienced in the transmission lines between the source and load devices. For example, a loose termination can result in a high connection resistance. The high resistance can result in heating that can in-turn result in fire. In-line faults are one of the primary causes of electrical fires in the power distribution industry. Eaves '637, column 3, described a method for comparing the transmission line voltage on the transmitter side with the transmission line voltage as measured by the receiver in the receiver side of the transmission line. The difference in voltage combined with a known value of electrical current can be used to determine the in-line power loss value.

However, practical considerations for sensor accuracy, electrical noise and wiring errors make it advantageous to derive a method for validating the receiver-voltage measurements. This specification provides a method for the transmitter to obtain a valid measurement of the transmission-line voltage, as sampled by the receiver, and for validating the measurement without interrupting the normal transfer of electrical energy under packet-energy-transfer (PET) protocol.

SUMMARY

Methods for obtaining a measurement of the transmission-line voltage from the receiver, for verifying the integrity of the measurement through comparison to transmitter side measurements, and for fault detection are described herein, where various embodiments of the methods and apparatus for performing the method may include some or all of the elements, features and steps described below.

In a digital-electricity power system comprising at least one transmitter, each transmitter monitors and controls voltage on a respective transmission line and interacts with one or more receivers connected to an opposite end of the respective transmission line, transmission-line voltage measurements are validated by acquiring a series of transmission-line voltage measurements during a sample period when a transmitter-disconnect device is in a non-conducting state. Numerical analysis is performed on the transmitter-voltage measurements to determine a point in time at which AC components in the transmission line have diminished and at which the primary change in the transmission-line voltage measurement values is due to DC decay and stores a first voltage measurement acquired at that point in time. The receiver is used to acquire a series of receiver-voltage measurements during the same sample period; and numerical analysis is performed on the receiver-voltage measurements to determine the point in time at which the AC components have diminished and at which the primary change in the transmission-line voltage measurement values is due to DC decay and storing a second voltage measurement acquired at that point in time. A difference calculation resulting from subtracting the first stored voltage measurement from the second stored voltage measurement is stored; and the transmitter-disconnect device is placed in a non-conducting state if the absolute value of the difference calculation is greater than a predetermined maximum value, wherein the transmission-line voltage measurements cannot be validated.

A method for detecting a series resistance fault is implemented in a digital-electricity power system that includes at least one transmitter and transmission lines in electrical contact with the transmitter. A controller is used to monitor and control voltage on at least one of the transmission lines and to interact with at least one receiver in electrical contact with the transmission lines. Sample values indicative of line-to-line voltage at the transmitter terminals and the receiver terminals are acquired, wherein at least one of the voltage sample values is acquired while electrical current is flowing in at least one of the transmission lines, and the voltage sample value is non-transitorily stored in computer-readable memory accessible by the controller. A sample value indicative of electrical current in at least one of the transmission lines is acquired along with the acquisition of the voltage sample within a time window over which the electrical current and voltage are substantially unchanged at sites on the transmission lines where the sample values are acquired, and the electrical-current sample value is non-transitorily stored in the computer-readable memory. The difference between the line-to-line voltage at the transmitter and the line-to-line voltage at the receiver is calculated to derive a transmission-line series voltage. Each transmission-line series voltage is divided by at least one of the stored electrical-current sample values to generate a ratio indicative of transmission-line series resistance. These steps are performed at least twice, wherein each iteration is separated by a time period; and the transmitter-disconnect device is placed in a non-conducting state if a difference in the ratio generated in one or more time periods exceeds a predetermined maximum, wherein exceeding the predetermined maximum is indicative of a series resistance fault, where the resistance fault varies significantly with transmission-line electrical current.

Another method for detecting a series resistance fault in the digital-electricity power system includes acquiring at least two sample values indicative of line-to-line voltage at the receiver terminals, wherein at least one of the voltage sample values is acquired while electrical current is flowing in at least one of the transmission lines, wherein the acquisitions of the voltage sample values are separated by a time period; and the voltage sample values are non-transitorily stored in computer-readable memory accessible by the controller. Sample values indicative of electrical current in at least one of the transmission lines are acquired, wherein each electrical-current sample value is taken along with at least one of the voltage measurements within a time window over which the current and voltage at sites on the transmission lines where the sample values are acquired are substantially unchanged for each set of electrical-current sample values and line-to-line voltage sample values. The electrical-current sample value is stored in computer-readable memory accessible by the controller. The stored electrical-current sample values are analyzed to identify a change in the electrical-current sample values over at least one of the time periods that exceeds a predetermined minimum, and the change in the electrical-current sample values and the corresponding change in the voltage sample values over the same time period are stored. The change in the voltage sample values is divided by the change in the electrical-current sample values to calculate a value indicative of transmission-line series resistance, wherein the calculation is valid provided that the line-to-line voltage at the receiver terminals remained substantially constant over the at least one time period when the voltage sample values and the electrical-current sample values were acquired. The series resistance value is compared to a predetermined maximum, wherein exceeding the predetermined maximums is indicative of a series resistance fault. A resistance is placed across the transmission lines that will be interpreted as a line-to-line fault by the controller, wherein the controller places a transmitter-disconnect device in a non-conducting state to disrupt electrical power transfer between the transmitter and the receiver when the series resistance exceeds the predetermined maximum.

The detection of line faults involves periodic measurement of transmission-line voltage (or another sample value indicative of the line-to-line voltage at the transmitter terminals and the receiver terminals, which may generally be referenced herein as "voltage sample values" or generally as "voltage measurements"). As will be described in detail, as line currents exceed 2-3 Amps on long transmission lines, detecting a fault representing excessive power loss on the transmission line becomes more difficult. This fault is referred to as an in-line fault. The difficulty can be alleviated by obtaining a signal representative of the voltage of the transmission line, measured on the receiver side of the transmission line. It is advantageous to have the ability to validate the measurement of the receiver-side voltage for accuracy without de-energizing the load. The disclosed method can be used to measure and ensure the integrity of the signal thus preventing false positive or false negative in-line fault determinations.

In executing PET protocol inherent to digital electricity, as described in Eaves '637, a portion of the total energy packet period is allocated for the transfer of energy from the source to the load. This portion is referred to as the transfer period. The remaining time in the packet period is allocated for detecting faults and transferring data. This portion of the packet is referred to as the sample period.

In a first embodiment of in-line power loss determination described in Eaves '637, Column 4, Lines 1-15, the transmitter samples the transmission line voltage obtained on the transmitter side of the transmission line during the transfer period when electrical current is allowed to flow in the line. A second measurement is taken by the transmitter during the sample period when no electrical current is flowing. The difference between the two voltage samples represents the voltage drop on the line between the transmitter and receiver. Multiplying the voltage drop by an electrical-current measurement performed by the transmitter produces a value representative of the in-line power loss on the transmission lines. If the loss exceeds a predetermined maximum, an in-line power fault is registered, and the transmitter de-energizes the line to avoid a fire or burn hazard.

In a second embodiment of in-line power-loss determination described in Eaves '637, Column 3, Lines 50-65, the transmitter acquires a measurement of the transmission-line voltage at the transmitter terminals during the transfer period, and receives a second measurement, via an external communications link, of the transmission-line voltage, as acquired by the receiver during the transfer period, at the receiver terminals. The difference between the two samples represents the voltage drop on the line between the transmitter and receiver. Multiplying the voltage drop by an electrical-current measurement performed by the transmitter produces a value representative of the in-line power loss on the transmission lines.

In the first embodiment, described above, it becomes difficult to measure voltage accurately during the sample period because of line reflections and electrical noise from external electro-magnetic sources and adjacent digital-electricity transmission lines. The difficulty increases with higher currents and power levels. Line reflections are more pronounced in transmission lines with lengths exceeding two kilometers. In practice, in these long transmission lines, electrical currents above three or four amperes present significant challenges for accurate calculation of in-line power loss where an accuracy within +/−10 Watts is desirable. These problems and some solutions are presented in detail in U.S. Pub. Pat Application No. 2018/0313886 A1 (Mlyniec Line Integrity).

The second embodiment avoids much of the trouble of the first embodiment by using transmitter-side and receiver-side measurements that occur during the transfer period and before the transmission line current is interrupted in the sample period. The interruption of the transmission line current is a primary cause of line reflections. Additionally, measurements during the transfer period are inherently less susceptible to electrical-noise sources because the transmission-line impedance is much lower (because the line is not electrically isolated by the source- and load-disconnect devices), meaning that much more energy to is required to impose noise upon it.

However, a shortcoming of the second embodiment, not anticipated by Eaves '637, can be improper validation of the receiver-side voltage measurement. For example, the receiver-side voltage-measurement circuitry can become uncalibrated, or a receiver with a different analog or digital gain factor can be inadvertently installed.

One less-desirable solution to this shortcoming can be to implement a self-test using a predetermined, calibrated, test voltage. Such a test, however, would need to be performed when the line is not transferring power, because any current in the transmission lines will cause a resistive voltage drop and, therefore, measurement error. Performing the test prior to initial power-up can also be impractical because the lines may afterwards operate for years without another opportunity to re-test and the test information may soon become "stale" and invalid. Periodically de-energizing the transmission lines to perform the test is impractical because the power provided is often critical to the operation of customer equipment.

A second less-desirable solution to the short-coming is to perform a test that compares the transmitter-side and receiver-side voltages during the transfer period, when current is flowing, and factor out the line-voltage drop due to current flow using software/firmware algorithmic methods. This approach, however, can also be impractical because the resistance and length of the transmission lines must be considered unknown to account for installation errors; and any operator input that might define it would be subject to human error.

An advantageous solution of exemplifications presented herein is to perform a calibration test during the sample period, rather than during the transfer period, and to then use the calibration to validate the transmission-line voltage measurements that are made during the transfer period. In other words, the second embodiment proposed by Eaves '637 for measuring transmission-line voltages during the transfer period can be combined with a calibration or validation of the voltage-measurement capability during the sample period.

When performing the calibration test during the sample period, the transmitter has interrupted current to the transmission lines. During the test, both the receiver and transmitter measure the transmission-line voltage. The receiver communicates the voltage to the transmitter, using either the external communication link proposed in Eaves '637 or the in-line communications method disclosed in U.S. Pat. No. 9,184,795 (Eaves Communication Patent). The transmitter verifies that the receiver voltage matches its own transmitter-side measurement.

Although the approach appears simple in theory, in practice it can be hindered by line reflections and electro-magnetic interference. Line reflections emanate from the disruption in current when the transmitter-disconnect device interrupts current in transmission lines. The line reflections and interference can appear as voltage peaks that "bounce" between the transmitter and receiver.

The technique exploits a novel principle for a digital electricity system to validate the receiver-voltage measurement.

During the sample period, when all alternating-current (AC) components have diminished, as determined by the transmitter, despite the fact that the line voltage may still be decaying on a direct-current (DC) level from factors, such as cross-line resistance or even a cross-line fault, the voltage at the transmitter terminals and the voltage at the receiver terminals should be equal, even when separated by a long distance. Any non-equality is indicative of hardware failure or miscalibration.

As is described in Eaves '637, both the transmitter and receiver components include disconnect devices that isolate the transmission lines from the energy source and the load during the sample period (the disconnect devices are referred to in Eaves '637 as the source disconnect and load disconnect). Any AC component on the transmission lines during the sample period is then a combination of either line reflections or electrical noise being induced onto the lines. By first determining when the AC components have diminished to an insignificant level, and then separating them from subsequent voltage samples that represent only DC decay on the transmission lines, a valid voltage calibration point can be obtained. If the AC components do not diminish during the sample period, then the system is considered unstable; and the transmitter will initiate a fault shut-down by opening its disconnect device.

The safety functions of a digital electricity system involve a) transmission-line voltage measurements made sequentially that are compared differentially, or, in the case of in-line faults, b) a differential comparison of the transmitter terminal voltage measurements, as made by the transmitter to receiver terminal voltage measurements. By having the ability to validate voltage measurements made by the transmitter and receiver, a resilient method to ensure accurate in-line fault measurements is obtained.

A first enhancement to the above method for verifying the integrity of voltage measurements includes measuring the transmission line series resistance (i.e., the cumulative resistance across the current path for the electricity) at the receiver side of the system. The receiver periodically acquires line-to-line voltage measurements at its input terminals while performing approximately simultaneous current measurements (or measurements of other sample values that are indicative of the electrical current, which may be herein referred to as "electrical-current sample values" or generally as "current measurements") in at least one of the transmission lines. The voltage and current measurements are stored in the load controller memory. The controller analyzes the transmission line current measurements for a change in magnitude and calculates the corresponding ratio of change in stored voltage measurements. The ratio of change in stored voltage measurements is an indication of transmission-line resistance (R) and can be calculated as a ratio of the change in voltage (V) over the change in current (I) over two distinct moments in time, 1 and 2, as follows:

$$R = \frac{V_2 - V_1}{I_2 - I_1}. \tag{1}$$

This evaluation is premised on the assumption that the transmitter voltage has remained relatively constant during the time of the measurements. The ratio representing series line resistance is communicated to the transmitter, where the transmitter source controller verifies the assumption that its voltage has remained relatively constant during the receiver measurements. The transmitter disconnects power to the transmission lines if the calculated series resistance exceeds a predetermined maximum value.

A second enhancement to the method for verifying the integrity of voltage measurements is disclosed for the purpose of detecting in-line resistance faults by detecting a current dependent change in the series resistance due to a higher-than-normal temperature coefficient of resistance (TCR) of the transmission circuit at a concentrated fault contact interface. Arcing or heating from a poor connection such as closely separated broken wire strands or a loose terminal screw can affect the material properties at the connection interface; such as the introduction of oxides (due to arcing) or carbon and chlorine from surrounding polymer insulators. The result is a much higher and often non-linear relationship between transmission line current and fault resistance per unit length of transmission line compared to normal copper or aluminum conductors that have a relatively small TCR compared to the fault contact interface.

The in-line fault resistance value, although much larger per unit length than that of normal copper or aluminum conductors, can have a small overall resistance value compared to the normal series resistance of a long transmission line. However, the time-varying resistance characteristics of the in-line fault can be separated from the primarily static resistance of normal conductors using analog or digital signal processing.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Figure 1:
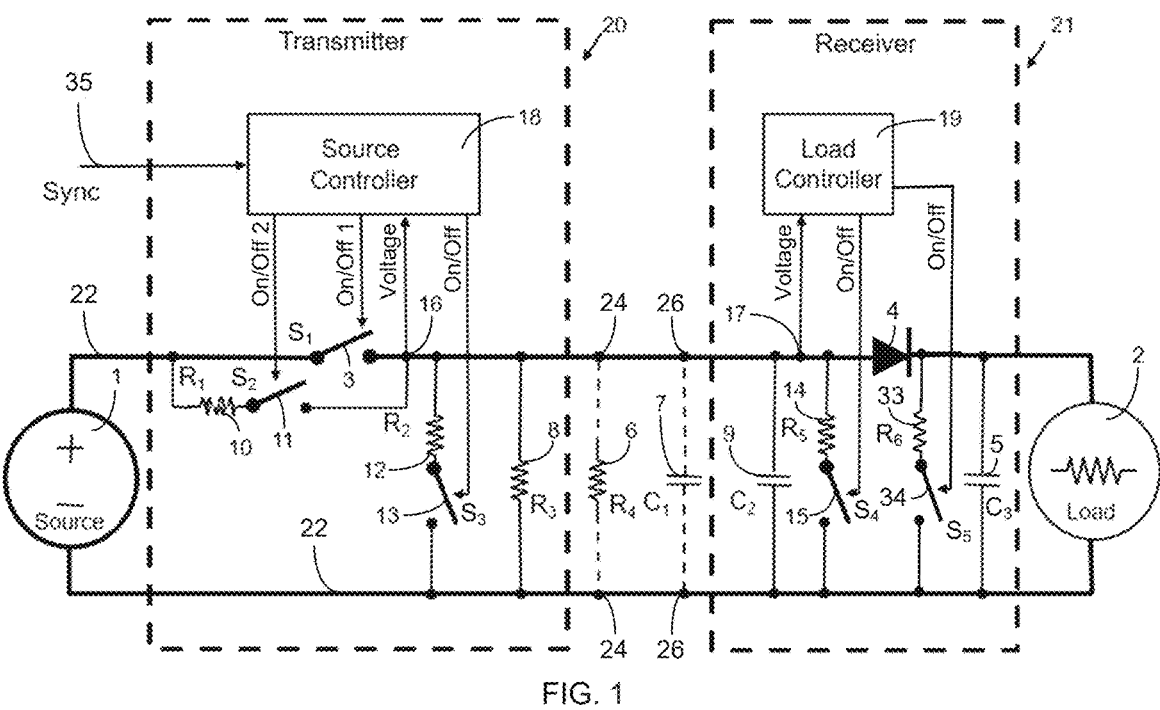
FIG. 1 is a block diagram of an exemplification of the safe power distribution system.

A representative digital-power system, similar to that originally described in Eaves '637, is shown in FIG. 1. The system includes a voltage source 1 and at least one load 2. The PET protocol is initiated by an operating switch 3 to periodically disconnect the source 1 from the power transmission lines 22 electrically joining the source 1 with the load 2. When the switch 3 is in an open (non-conducting) state, the lines are also isolated by isolation diode $(D_1)$ 4 from any stored energy that may reside at the load 2.

Eaves '637 offered several versions of alternative switches that can replace the isolation diode 4, and all versions can produce similar results when used in the presently described methods. Capacitor $C_3$ 5 is representative of an energy-storage element on the load side of the circuit.

The transmission lines 22 have inherent line-to-line resistance $R_4$ 6 and capacitance $C_1$ 7. The PET system architecture, as described by Eaves '637, adds additional line-to-line resistance $R_3$ 8 and capacitance $C_2$ 9. At the instant switch 3 is opened, capacitances $C_1$ 7 and $C_2$ 9 have stored charge that decays at a rate that is inversely proportional to the additive values of resistances $R_4$ 6 and $R_3$ 8. Capacitor $C_3$ 5 does not discharge through resistances $R_3$ 8 and $R_4$ 6 due to the reverse blocking action of isolation diode $D_1$ 4. The amount of charge contained in capacitors $C_1$ 7 and $C_2$ 9 is proportional to the voltage across them and can be measured at points 16 and 17 by a source controller 18, which is optionally connected to a sync line input 35, or by a load controller 19.

Figure 2:
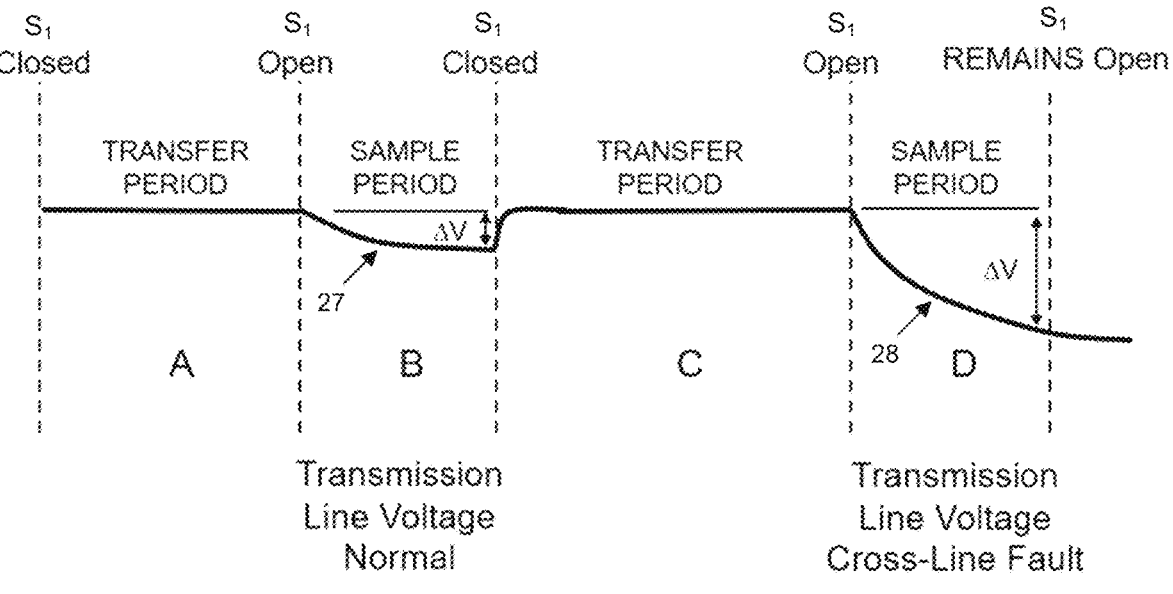
FIG. 2 is an illustration of a packet-energy-transfer voltage waveform.

As described in Eaves '637, a change in the rate of decay of the energy stored in capacitances $C_1$ 7 and $C_2$ 9 can indicate that there is a cross-line fault on the transmission lines 22. The difference between normal operation 27 and a fault 28, as presented by Eaves '637, is illustrated in FIG. 2.

Referring again to FIG. 1, the combination of switch $S_1$ 3; source controller 18; resistor $R_1$ 10; switch $S_2$ 11; resistor $R_2$ 12; switch $S_3$ 13; and resistor $R_3$ 8 can be referred to as a transmitter 20. The combination of switch $S_4$ 15; resistor $R_5$ 14; switch $S_5$ 34; resistor $R_6$ 33; load controller 19; diode $D_1$ 4; capacitor $C_2$ 9; and capacitor $C_3$ 5 can be referred to as a receiver 21.

Figure 3:
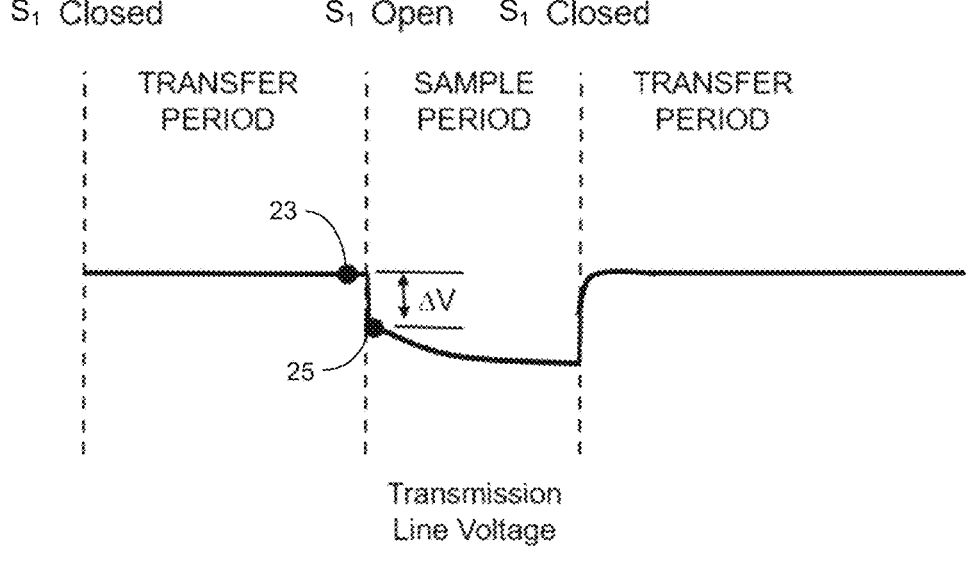
FIG. 3 illustrates in-line power loss determination for a transmission line in the absence of electrical noise or line reflections.

A method to measure in-line resistance without a communications link, as specified in Eaves '637, is depicted in FIG. 3, which shows an ideal case where there are no line reflections or external electrical noise. The transmitter 20 measures its terminal voltage and electrical current nearly simultaneously in a first sample 23 during the same energy-transfer period just before opening the source disconnect $S_1$ 3. The transmitter 20 opens disconnect switch $S_1$ 3 and immediately takes another voltage sample 25. The difference between the first and second voltage samples 23 and 25 is proportional to the line resistance. The voltage difference between the first and second voltage samples 23 and 25 is independent of the normal, slower decay in voltage that occurs for the remainder of the sample period because the second voltage sample 25 is taken before the voltage on the transmission lines 22 has had time to decay significantly. By multiplying the difference in voltage by the current measurement, a value of in-line power loss is obtained.

Figure 4:
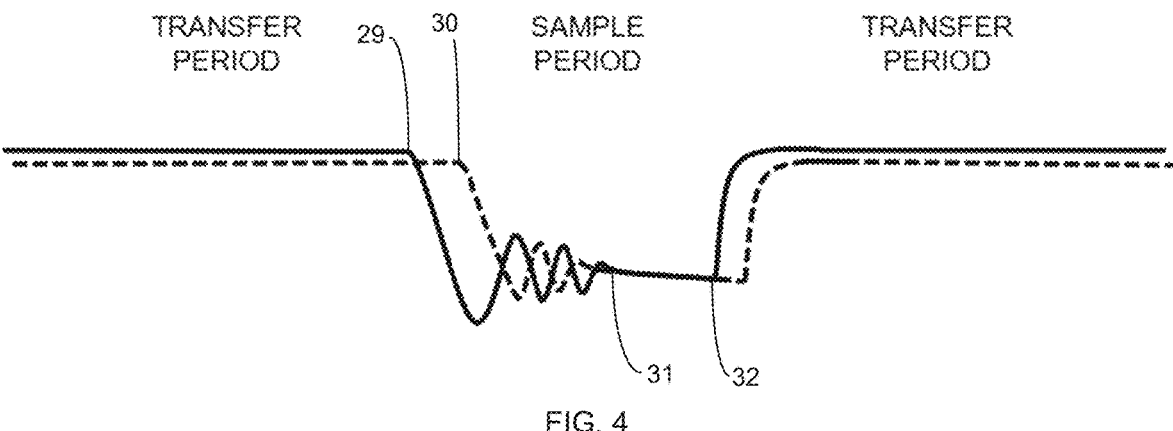
FIG. 4 illustrates an in-line power loss determination for a long transmission line with line reflections.

FIG. 4 depicts the transmission-line voltage as seen by the transmitter 20 (solid line) and as seen by the receiver 21 (dashed line) in a longer transmission line and/or at higher electrical currents. In this case, line reflections increase the complexity of making the simple in-line power-loss calculation described for FIG. 3. At the point where the transmitter-disconnect switch $S_1$ 3 is opened 29, the line voltage is higher at the transmitter terminals 24 than it is at the receiver terminals 26 due to the voltage drop when current is passed through the resistance of the transmission line 22. As can be seen by the difference in the horizontal axis positions of points 29 and 30 in FIG. 3 (representing the voltage at the transmitter terminals 24 and receiver terminals 26, respectively), there is also a time delay, due to the inductive and capacitive elements of the line 22, from when the transmitter disconnect first causes a drop in voltage 29, as seen at the transmitter terminals 24, and when the drop 30 is first seen at the receiver terminals 26. Using numerical-processing techniques well known in the signal-processing industry, the transmitter processor and receiver processor can make a determination of when the AC components of the transmission-line voltage have diminished to an insignificant value, at point 31, and where the remaining change in voltage is a DC decay due to the cross-line resistance of the transmission lines 22 or a cross-line fault, both of which are forms of DC decay. Further refinements on separating DC decay from AC components were described in the Mlyniec Line Integrity Patent, but Mlyniec did not disclose the ability to validate receiver-side measurements. At point 32, the transmitter closes the disconnect switch $S_1$ 3 again, and the voltage of the transmission line 22 rises.

It is in the area between points 31 and 32 that the voltage, as measured at the transmitter terminals 24, and the voltage, as measured by the receiver terminals 26, should match. Both the transmitter 20 and receiver 21 then calculate an average voltage value for the period between points 31 and 32. The receiver 21 transmits the average voltage value that it measured to the transmitter 20 using the communications link described in Eaves '637 or using a communications data stream imposed on the transmission lines 22, as described in the Eaves Communication patent.

In some cases, it would be useful for the transmitter 20 to vary the value of its voltage source for the purposes of performing voltage measurements over a wider range and, therefore, testing whether the voltage measurements by the receiver 21 and voltage measurements by the transmitter 20 continue to match during the DC decay period. This technique can uncover problems related to gain error in the analog or digital calibration of the voltage sensing components. Alternatively, via the transmitter 20 changing its source voltage according to a predetermined pattern, the technique can be used to verify that the transmitter 20 is communicating with the correct receiver 21, particularly when an external communication link is used, as the communication connection could be inadvertently connected between the wrong transmitter 20/receiver 21 pair.

A first enhancement to the above method for verifying the integrity of voltage measurements includes measuring the transmission line in-line (series) resistance at the receiver side of the system. Referring to FIG. 1, the receiver 21 periodically acquires line-to-line voltage measurements at its input terminals while performing approximately simultaneous transmission-line current measurements. The voltage and current measurements are stored in the computer-readable memory of the receiver load controller 19. The load controller analyzes the transmission line current measurements for a change in magnitude and calculates the corresponding ratio of change (as expressed in Equation 1, above) in the stored voltage measurements. The ratio is indicative of transmission-line series resistance (i.e., the cumulative resistance over the current path through the transmission line), with the assumption that the voltage has remained relatively constant during the time of the measurements. The ratio representing transmission-line series resistance is communicated to the transmitter 20, where that transmitter source controller 18 verifies the assumption that its voltage has remained relatively constant during the receiver measurements. The transmitter disconnects power to the transmission lines by opening the S1 source disconnect 3 if the calculated transmission-line series resistance exceeds a predetermined maximum value.

One modification to the method above for measuring transmission line series resistance at the receiver is where the receiver load controller 19 operates S5 switch 34 to enable an internal load 33 (e.g., in the form of a resistor or other circuitry that can change the current level) to apply a load current to the transmission lines 22, as shown in FIG. 1. Alternatively, the receiver load controller 19 can operate the S4 switch 15 to enable an internal load 14 to apply a load current to the transmission lines during the transfer period when the transmitter-disconnect device is in a conducting state where the application of the load will not be interpreted as a line-to-line fault by the transmitter. This practice offers a direct method to affect a change in transmission line current that does not depend on a change in current demand from the external load 2. The external load may be connected or disconnected during the application of the internal load 33 by the action of the receiver load controller 19 as has been described in U.S. Pat. No. 9,419,436. In cases where the external load 2 is not disconnected when the internal load 33 is applied, the load controller 19 may perform a calculation to ensure that the receiver 21 has sufficient capacity to service both loads simultaneously before activating the internal load 33.

In the case of disconnecting the external load 2, the receiver 21 would perform the function as a self-check at start-up or restart. In the case where the external load 2 is not disconnected while the internal load 33 is applied, the internal load 33 would be additive to the normal external load 2 on the receiver 21 and would not result in disabling operation of the external load 2. When using a resistor as the internal load 33, the current on the transmission lines 22 due to the internal load 33 would be a known value because it would be a fixed resistance, e.g., the load current can be calculated by the load controller 19 by dividing the receiver terminal voltage by the known load resistance. In other variations, the internal load 33 can be substituted by a DC-DC converter circuit that provides a controllable internal load current. In further variations, a current sensor can be applied to the internal load circuit to provide a direct measurement of the current to load controller 19.

In yet another modification, rather than the value indicative of series transmission line resistance being communicated to the transmitter for determination of a fault, receiver load controller 19 can initiate a shutdown of the transmitter by closing S4 switch 15 at the receiver. Closing the S4 switch 15 will connect R5 pull-down resistor 14 across the conductors of the transmission lines 22. The pull-down, if activated for a sufficient time frame, will be resolved as a line-to-line fault by the transmitter 20 as is described in prior art Eaves '637. To further validate the determination of a fault, the receiver 21 may communicate with the transmitter 20 to verify the transmitter output voltage that existed while the receiver voltage measurements were acquired; or, in a simplified embodiment, the receiver 21 can simply make an assumption that the transmitter voltage was held constant during the receiver measurements.

A second enhancement to the method for verifying the integrity of voltage measurements is disclosed for the purpose of detecting in-line (series) resistance faults by detecting a current dependent change in the series resistance due to a higher-than-normal temperature coefficient of resistance (TCR) of the transmission circuit at a concentrated fault contact interface. The TCR method detects dynamic changes in transmission-line series resistance resulting from the much larger and often non-linear TCR attributable to in-line faults. Arcing or heating from a poor connection, such as a poor splice or loose terminal screw, can affect the material properties at the connection interface by introducing foreign materials such as oxides, carbon or chlorine, some of which are introduced from surrounding polymer insulators. The resistance of the fault can be small relative to the normal series resistance of a long transmission line 22. However, the time varying resistance characteristics of the in-line fault can be separated from the primarily static resistance of normal conductors using analog or digital signal processing.

The TCR method can enhance the in-line resistance calculation methods taught by Eaves '637 and can also enhance the methods described herein, where the transmitter- and receiver-acquired voltages are compared for validation. In the TCR method, samples representative of the voltage at the transmitter terminals and receiver terminals are acquired, closely separated in time where at least one of the voltage measurements is made while current is flowing in the transmission line 22. At least one sample of the transmission-line current is made at substantially the same time as the voltage samples, wherein the "substantially the same time" characterization is inclusive of short time differences over which the current and voltage does not change much at the sites of measurement (e.g., by no more than 1%, 2%, 3%, etc.). The difference between the voltage samples is divided by the current to produce a value indicative of the series resistance of the transmission line circuit. The voltage and current samples and resistance calculation are performed again after a predetermined time period. Under normal conditions without an in-line resistance fault, the resistance values over the time period should remain relatively constant even with varying line current.

When a series fault is present, the larger and often non-linear TCR of the fault contact interface introduces an excessive change in line resistance during the sample period. This fault contact area comprises the fault contact interface and the affected material surrounding it, where the affected material is typically the cable insulation, cable filler, and other constituents of the cable but may also include other external material impacted by the temperature rise, particularly if the cable insulation is compromised. Depending on the material composition of the fault contact area the TCR can be a large negative value, meaning that the resistance will decrease over time for a given current as ohmic heating increases the temperature of the contact area. Because the power applied to the fault contact area is proportional to the square of the transmission-line current, a strong non-linear relationship is established between the transmission-line series resistance and current. The non-linear relationship may be further augmented by the TCR itself varying with temperature due to the complex material properties of the fault contact area relative to the TCR of normal transmission line conductors. Because of these non-linear relationships, it may be advantageous to extend the time the circuit is disabled after a fault is detected before restart to allow the contact area to cool, thus providing a significantly higher, and more readily detectable initial resistance for positive TCR materials or significantly lower initial resistance for negative TCR materials.

As described herein, the transmitter initiates a shut-down of power to the transmission-lines by placing S1 transmitter disconnect 3 into a non-conducting (open) state. An alternate method for de-energizing the transmission lines 22 is to control the transmitter power conversion circuitry to provide a voltage and or current of approximately zero, or to a value safe for human contact and fire prevention. Methods for achieving this result are disclosed in Eaves '637, claims 8 and 12. It is commonly known to the industry that many power converters offer a control input that would allow the voltage and/or current to be reduced to a low value during a fault condition.

For all methods that acquire multiple sample values within a time window when the electrical current and voltage on the transmission lines are substantially unchanged (i.e., approximately simultaneous sampling measurements), the tolerance for the timing of the sampling is dictated by the system design. Since the current draw of the load can change over time and other external factors may apply, delay between samples within said sampling will result in increased error. Circuit elements, such as the capacitor $C_3$ 5 can reduce how quickly load changes will affect the circuit at the transmitter output terminal 16 and at the receiver input terminal 17 and will allow a greater delay between samples within said sampling. The maximum time allowed to complete one set of approximately simultaneous sampling measurements is therefore defined by how much measurement error can be tolerated based on the limit chosen, and how much changes in the current draw of the load can affect the circuit at the transmitter output terminal 16 and receiver input terminal 17 within that time period.

There are a number of numerical techniques well known to the signal-processing industry to extract the average voltage value between point 28 and point 30 of FIG. 3. These techniques can include simple averaging, digital filtering or interpolation methods, some of which are described in the Mlyniec Line Integrity Patent. Signal-processing tasks otherwise performed by the receiver 21 can be off-loaded to the transmitter 20 by transmitting "raw" voltage measurements from the receiver 21 to the transmitter 20.

The systems and methods of this disclosure can be implemented in a computing-system environment. Examples of well-known computing system environments and components thereof that may be suitable for use with the systems and methods include, but are not limited to, personal computers, server computers, hand-held or laptop devices, tablet devices, smart phones, multiprocessor systems, microprocessor-based systems, set-top boxes, programmable consumer electronics, network personal computers (PCs), minicomputers, mainframe computers, distributed computing environments that include any of the above systems or devices, and the like. Typical computing system environments and their operations and components are described in many existing patents (e.g., U.S. Pat. No. 7,191,467, owned by Microsoft Corp.).

The methods may be carried out via non-transitory computer-executable instructions, such as program modules. Generally, program modules include routines, programs, objects, components, data structures, and so forth, that perform particular tasks or implement particular types of data. The methods may also be practiced in distributed computing environments where tasks are performed by remote processing devices that are linked through a communications network. In a distributed computing environment, program modules may be located in both local and remote computer storage media including memory storage devices.

The processes and functions described herein can be non-transitorily stored in the form of software instructions in the computer. Components of the computer may include, but are not limited to, a computer processor, a computer storage medium serving as memory, and a system bus that couples various system components including the memory to the computer processor. The system bus can be of any of several types of bus structures including a memory bus or memory controller, a peripheral bus, and a local bus using any of a variety of bus architectures.

The computer typically includes one or more a variety of computer-readable media accessible by the processor and including both volatile and nonvolatile media and removable and non-removable media. By way of example, computer-readable media can comprise computer-storage media and communication media.

The computer storage media can store the software and data in a non-transitory state and includes both volatile and nonvolatile, removable and non-removable media implemented in any method or technology for storage of software and data, such as computer-readable instructions, data structures, program modules or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed and executed by the processor.

The memory includes computer-storage media in the form of volatile and/or nonvolatile memory such as read only memory (ROM) and random access memory (RAM). A basic input/output system (BIOS), containing the basic routines that help to transfer information between elements within the computer, such as during start-up, is typically stored in the ROM. The RAM typically contains data and/or program modules that are immediately accessible to and/or presently being operated on by the processor.

The computer may also include other removable/non-removable, volatile/nonvolatile computer-storage media, such as (a) a hard disk drive that reads from or writes to non-removable, nonvolatile magnetic media; (b) a magnetic disk drive that reads from or writes to a removable, non-volatile magnetic disk; and (c) an optical disk drive that reads from or writes to a removable, nonvolatile optical disk such as a CD ROM or other optical medium. The computer-storage medium can be coupled with the system bus by a communication interface, wherein the interface can include, e.g., electrically conductive wires and/or fiber-optic pathways for transmitting digital or optical signals between components. Other removable/non-removable, volatile/non-volatile computer storage media that can be used in the exemplary operating environment include magnetic tape cassettes, flash memory cards, digital versatile disks, digital video tape, solid state RAM, solid state ROM, and the like.

The drives and their associated computer-storage media provide storage of computer-readable instructions, data structures, program modules and other data for the computer. For example, a hard disk drive inside or external to the computer can store an operating system, application programs, and program data.

Thus, the scope of the disclosed invention should be determined by the appended claims and their legal equivalents, rather than the examples given. In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. Still further, the components, steps and features identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

I claim:

1. A method for detecting a series resistance fault, comprising:

a) in a digital-electricity power system, comprising at least one transmitter and transmission lines in electrical contact with the transmitter, using at least one controller to monitor and control voltage on at least one of the transmission lines and to interact with at least one receiver in electrical contact with the transmission lines;

b) acquiring sample values indicative of line-to-line voltage at the transmitter terminals and the receiver terminals, wherein at least one of the voltage sample values is acquired while electrical current is flowing in at least one of the transmission lines, and non-transitorily storing the voltage sample value in computer-readable memory accessible by a controller of the at least one controller;

c) acquiring a sample value indicative of electrical current in at least one of the transmission lines along with the acquisition of the voltage sample within a time window over which the electrical current and voltage are substantially unchanged at sites on the transmission lines where the sample values are acquired and non-transitorily storing the electrical-current sample value in the computer-readable memory;

d) calculating the difference between the line-to-line voltage at the transmitter and the line-to-line voltage at the receiver to derive a transmission-line series voltage;

e) dividing the transmission-line series voltage by at least one of the stored electrical-current sample values to generate a ratio indicative of transmission-line series resistance; and f) performing steps (b) through (e) at least twice, wherein each iteration is separated by a time period, and placing the transmitter-disconnect device in a non-conducting state if a difference in the ratio generated in one or more time periods exceeds a predetermined maximum, wherein exceeding the predetermined maximum is indicative of a series resistance fault, where the resistance fault varies significantly with transmission-line electrical current.

2. The method of claim 1, wherein the transmitter-disconnect is placed in the non-conducting state after fault detection and prevented from restarting for a time period sufficient to allow cooling of a series fault contact area before being placed back in a conductive state to verify the fault, wherein due to a non-linear relationship between series resistance and electrical current at the series fault contact area, a larger and more detectable change in series resistance can be detected when electrical current is reapplied to the transmission line.

3. The method of claim 1, wherein steps (b) through (e) are performed at the transmitter or at the receiver.

4. A method for detecting a series resistance fault, comprising:

a) in a digital-electricity power system, comprising (i) at least one transmitter including transmitter terminals and (ii) transmission lines in electrical contact with the transmitter terminals, using at least one controller to monitor and control voltage on at least one of the transmission lines and to interact with at least one receiver including receiver terminals in electrical contact with the transmission lines;

b) acquiring at least two sample values indicative of line-to-line voltage at the receiver terminals, wherein at least one of the voltage sample values are acquired while electrical current is flowing in at least one of the transmission lines, wherein the acquisitions of the voltage sample values are separated by a time period, and non-transitorily storing the voltage sample values in computer-readable memory accessible by a controller of the at least one controller;

c) acquiring sample values indicative of electrical current in at least one of the transmission lines, wherein each electrical-current sample value is taken along with at least one of the voltage measurements within a time window over which the current and voltage at sites on the transmission lines where the sample values are acquired are substantially unchanged for each set of electrical-current sample values and line-to-line voltage sample values, and non-transitorily storing the electrical-current sample value in computer-readable memory accessible by the controller of step (b);

d) analyzing the stored electrical-current sample values to identify a change in the electrical-current sample values over at least one of the time periods that exceeds a predetermined minimum and storing the change in the electrical-current sample values and the corresponding change in the voltage sample values over the same time period;

e) dividing the change in the voltage sample values by the change in the electrical-current sample values to calculate a value indicative of transmission-line series resistance, wherein the calculation is valid provided that line-to-line voltage at the transmitter terminals remained substantially constant during the time of measurements of the voltage sample values and the electrical-current sample values; and f) comparing the series resistance value to a predetermined maximum, wherein exceeding the predetermined maximum is indicative of a series resistance fault, and acting to provide a voltage and/or current of approximately zero or at a value safe for human contact and fire prevention when the series resistance exceeds the predetermined maximum.

5. The method of claim 4, wherein the controller that can access the computer-readable memory that stores the voltage sample value and the electrical-current sample value is in the receiver, and wherein the transmitter includes a source controller, the method further comprising transmitting the ratio representing transmission-line resistance to the source controller, wherein the source controller verifies that the transmitter had an output voltage that remained approximately constant during the measurement of the voltage sample values and the electrical-current sample values before placing the transmitter-disconnected in the non-conducting state if the value indicative of the transmission-line series resistance exceeds the predetermined maximum.

6. The method of claim 4, wherein the at least one controller includes a controller in the transmitter, the method further comprising communicating an output voltage of the transmitter to the receiver, wherein a second controller in the receiver verifies that the transmitter output voltage remained substantially unchanged while the voltage sample values and the electrical-current sample values are taken.

7. The method of claim 4, wherein the receiver includes a load controller, wherein the load controller activates a load internal to the receiver, wherein the load has a pre-determined resistance value to cause an electrical current to flow in the transmission lines, and wherein a value indicative of the transmission-line series resistance is calculated with an electrical current in the transmission lines that is independent of load at the receiver output.

8. The method of claim 7, where the internal load is only applied if the receiver has sufficient capacity to service an external load and the internal load simultaneously.

9. The method of claim 4, wherein steps (b) through (f) are performed at the receiver.

10. The method of claim 4, wherein upon determining the presence of a series resistance fault, the receiver acts to place a resistance across the transmission lines that will be interpreted as a line-to-line fault by a controller of the at least one controller.

11. The method of claim 4, wherein upon determining the presence of a series resistance fault, a controller of the at least one controller places a transmitter-disconnect device in a non-conducting state to disrupt electrical power transfer between the transmitter and the receiver.

12. The method of claim 4, wherein the transmitter includes a source-disconnect device, wherein the receiver includes a load-disconnect device, and wherein at least one of the voltage sample values is acquired during the transfer period while the source-disconnect device and the load-disconnect device are in a conducting state.

13. The method of claim 4, wherein the digital-electricity power system further comprises at least one load, and wherein the transmission lines are isolated from any stored energy that may reside at the load, wherein said transmission lines are isolated by an isolation diode.

14. The method of claim 13, wherein the receiver includes a load-disconnect device, wherein at least one of the voltage sample values is acquired while the load-disconnect device is in a conducting state.

* * * * *